United States Patent
Bradshaw

(10) Patent No.: US 11,636,009 B2
(45) Date of Patent: Apr. 25, 2023

(54) ENHANCED ERROR CORRECTING CODE CAPABILITY USING VARIABLE LOGICAL TO PHYSICAL ASSOCIATIONS OF A DATA BLOCK

(71) Applicant: Micron Technology, Inc., Boise, ID (US)

(72) Inventor: Samuel E. Bradshaw, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/079,020

(22) Filed: Oct. 23, 2020

(65) Prior Publication Data

US 2021/0042190 A1 Feb. 11, 2021

Related U.S. Application Data

(62) Division of application No. 15/877,008, filed on Jan. 22, 2018, now Pat. No. 10,831,596.

(51) Int. Cl.
| | | |
|---|---|---|
| G06F 11/00 | (2006.01) | |
| G06F 11/10 | (2006.01) | |
| H03M 13/00 | (2006.01) | |
| G06F 12/02 | (2006.01) | |

(52) U.S. Cl.
CPC ...... *G06F 11/1068* (2013.01); *G06F 11/1012* (2013.01); *G06F 11/1072* (2013.01); *H03M 13/00* (2013.01); *G06F 12/0246* (2013.01)

(58) Field of Classification Search
CPC ............ G06F 11/1068; G06F 11/1012; G06F 11/1072; G06F 12/0246; H03M 13/00
See application file for complete search history.

(56) References Cited

U.S. PATENT DOCUMENTS

| | | | | |
|---|---|---|---|---|
| 5,247,523 | A | * | 9/1993 | Arai ...................... H03M 13/03 714/755 |
| 5,490,264 | A | | 2/1996 | Wells et al. |
| 5,687,182 | A | * | 11/1997 | Shikakura ............. H03M 13/29 714/704 |

(Continued)

FOREIGN PATENT DOCUMENTS

| | | |
|---|---|---|
| EP | 2998869 A1 | 3/2016 |
| WO | 2012121968 A2 | 9/2012 |

OTHER PUBLICATIONS

C. Yang et al.,"Product Code Schemes for Error Correction in MLC NAND Flash Memories" IEEE transactions on Very Large Scale Intergration (VLSI) Systems (vol. 20, Issue: 12, Dec. 2012).

(Continued)

*Primary Examiner* — Loan L. T. Truong
(74) *Attorney, Agent, or Firm* — Lowenstein Sandler LLP

(57) ABSTRACT

An instance of an event associated with error correcting code operations performed on a data block of the non-volatile memory is identified. An entry for a record is generated. The entry is indicative of the instance of the event. Whether a frequency of the event satisfies a threshold condition based on the record is determined. Responsive to determining that the frequency of the event satisfies the threshold condition, a remix operation on the data block is performed to change a logical to physical association of the data block from a first logical association to a second logical association.

20 Claims, 10 Drawing Sheets

(56) References Cited

U.S. PATENT DOCUMENTS

| | | | |
|---|---|---|---|
| 5,943,693 A | 8/1999 | Barth | |
| 6,606,718 B1 | 8/2003 | Bessios | |
| 6,978,343 B1 | 12/2005 | Ichiriu | |
| 7,380,200 B2 | 5/2008 | Dent | |
| 7,562,282 B1* | 7/2009 | Rothberg | G11B 20/1883 714/784 |
| 7,600,177 B2 | 10/2009 | Qian et al. | |
| 7,856,584 B2 | 12/2010 | Ovchinnikov et al. | |
| 8,209,582 B1 | 6/2012 | Varnica et al. | |
| 8,566,664 B2 | 10/2013 | Wu et al. | |
| 8,874,835 B1* | 10/2014 | Davis | G06F 3/0679 711/156 |
| 9,047,203 B1 | 6/2015 | Rumbolt | |
| 9,158,672 B1 | 10/2015 | Zheng et al. | |
| 9,391,641 B2 | 7/2016 | Subramanian et al. | |
| 9,424,131 B2 | 8/2016 | Tang et al. | |
| 9,432,058 B2 | 8/2016 | Ku et al. | |
| 9,858,518 B2* | 1/2018 | Nishizaki | G06K 7/1473 |
| 9,998,148 B2 | 6/2018 | Lin et al. | |
| 10,108,503 B2 | 10/2018 | Noe et al. | |
| 10,312,944 B2 | 6/2019 | Khayat et al. | |
| 10,331,514 B2 | 6/2019 | Kaynak et al. | |
| 10,387,276 B2* | 8/2019 | Ryu | G06F 11/108 |
| 10,439,648 B1 | 10/2019 | Khayat et al. | |
| 2002/0049947 A1* | 4/2002 | Sridharan | H03M 13/2903 714/752 |
| 2003/0145274 A1* | 7/2003 | Hwang | H03M 13/47 714/799 |
| 2005/0273688 A1* | 12/2005 | Argon | H04L 1/0063 714/755 |
| 2006/0156180 A1* | 7/2006 | Kang | G11B 20/1883 |
| 2007/0015774 A1 | 1/2007 | Mallams et al. | |
| 2007/0150774 A1* | 6/2007 | Seng | G11B 20/1217 714/699 |
| 2009/0320041 A1 | 12/2009 | Noguchi et al. | |
| 2010/0011276 A1 | 1/2010 | Chen et al. | |
| 2010/0122146 A1* | 5/2010 | Nazarian | G06F 11/1072 714/763 |
| 2010/0162081 A1 | 6/2010 | Joo | |
| 2010/0228940 A1 | 9/2010 | Asnaashari et al. | |
| 2010/0313099 A1 | 12/2010 | Yamaga | |
| 2012/0110417 A1 | 5/2012 | D Abreu et al. | |
| 2012/0304039 A1 | 11/2012 | Peterson et al. | |
| 2012/0311406 A1 | 12/2012 | Ratnam et al. | |
| 2014/0075263 A1 | 3/2014 | Ku et al. | |
| 2014/0189210 A1 | 7/2014 | Sinclair et al. | |
| 2014/0241098 A1 | 8/2014 | Son et al. | |
| 2014/0258804 A1 | 9/2014 | Pangal et al. | |
| 2014/0281814 A1 | 9/2014 | Vogan et al. | |
| 2015/0082124 A1 | 3/2015 | Tang et al. | |
| 2015/0095546 A1* | 4/2015 | Bennett | G06F 12/0246 711/5 |
| 2015/0169398 A1 | 6/2015 | Chunn et al. | |
| 2015/0220385 A1 | 8/2015 | Wood et al. | |
| 2015/0347254 A1* | 12/2015 | Jones | G06F 11/2094 714/6.13 |
| 2016/0188206 A1 | 6/2016 | Sinclair | |
| 2016/0252943 A1 | 9/2016 | Varma et al. | |
| 2016/0315635 A1* | 10/2016 | Cai | H03M 13/356 |
| 2016/0359503 A1 | 12/2016 | Li et al. | |
| 2017/0024127 A1 | 1/2017 | Bazarsky et al. | |
| 2017/0077962 A1 | 3/2017 | Yang | |
| 2017/0187395 A1 | 6/2017 | Watanabe et al. | |
| 2018/0083653 A1 | 3/2018 | Khayat et al. | |
| 2018/0115325 A1* | 4/2018 | Blaettler | H03M 13/2951 |
| 2018/0167088 A1* | 6/2018 | Vakilinia | H03M 13/2945 |
| 2018/0268913 A1* | 9/2018 | Akkerman | G11C 16/349 |
| 2019/0107958 A1 | 4/2019 | Bradshaw | |
| 2019/0171518 A1 | 6/2019 | Pruett et al. | |
| 2019/0294496 A1* | 9/2019 | Lien | G06F 11/1068 |

OTHER PUBLICATIONS

International Search Report and Written Opinion on application No. PCT/US2019/014045, dated May 1, 2019.

\* cited by examiner

ENHANCED ERROR CORRECTING CODE CAPABILITY USING VARIABLE LOGICAL TO PHYSICAL ASSOCIATIONS OF A DATA BLOCK

RELATED APPLICATION

This application is a divisional of U.S. patent application Ser. No. 15/877,008, filed Jan. 22, 2018, the entire contents of which are hereby incorporated by reference herein.

TECHNICAL FIELD

The disclosure generally relates to a memory device, and more specifically, relates to enhancing error correcting code capability using variable logical to physical associations of a data block.

BACKGROUND

A storage device may include one or more memory components that store data. For example, a solid-state drive (SSD) may include memory devices such as non-volatile memory devices. The SSD may further include an SSD controller that may manage each of the memory devices and allocate data to be stored at the memory devices. A host system may utilize the SSD and request data from the SSD. The SSD controller may be used to retrieve data from the corresponding memory devices and return the retrieved data to the host system.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
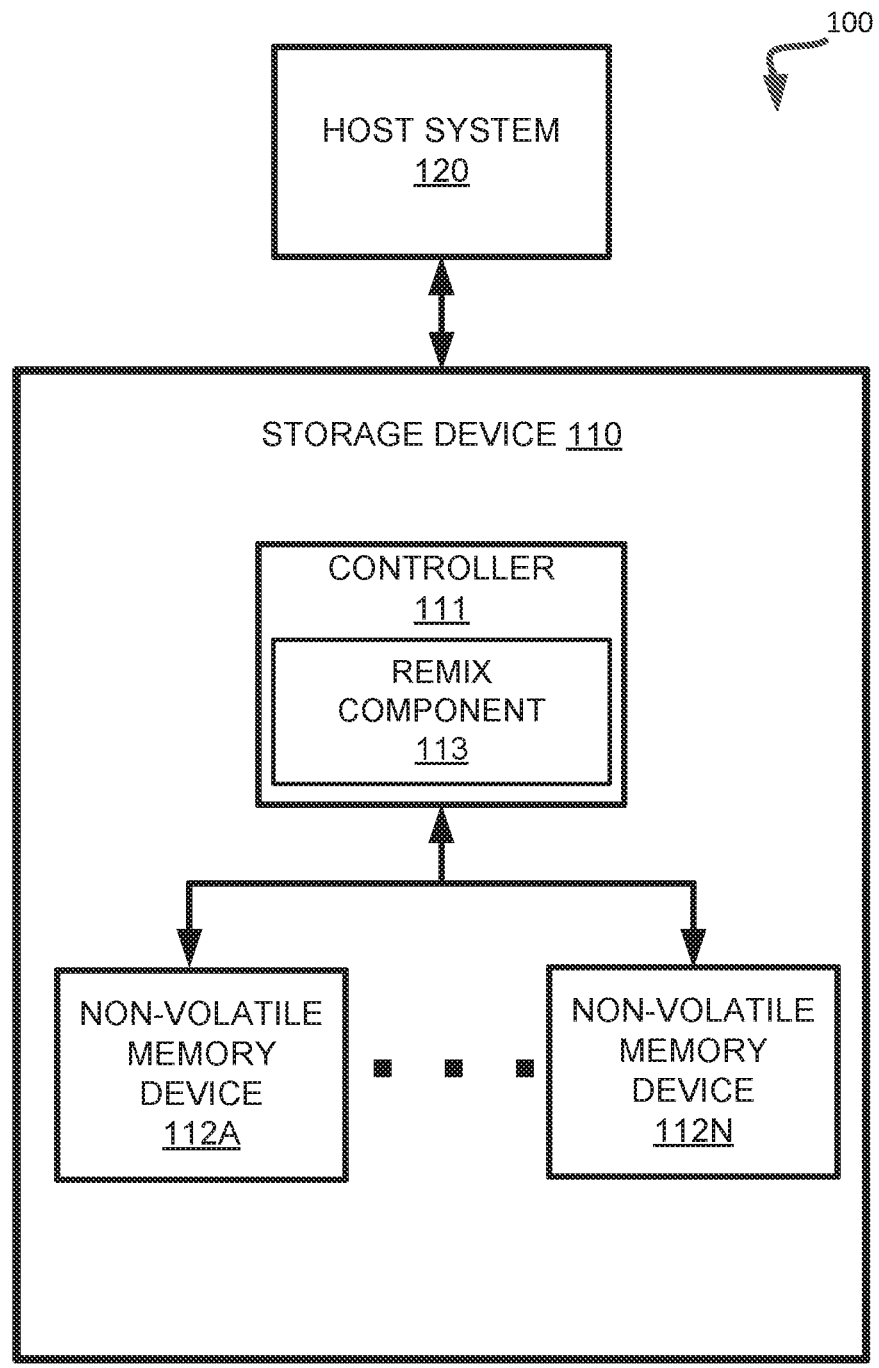
FIG. 1 illustrates an example computing environment that includes a storage device, in accordance with some embodiments of the disclosure.

In general, a host system may utilize a storage device that includes one or more memory devices. The host system may provide data to be stored at the storage device and may subsequently retrieve data stored at the storage device. The data may be stored and retrieved from the memory devices within the storage device.

An example of a storage device is a solid-state drive (SSD) that includes non-volatile memory and a controller to manage the non-volatile memory. The controller may encode data into a format for storage at the storage device. For example, a class of error detection and correcting codes (ECC), such as product codes, may be used to encode the data. In product codes, a data block may be arranged or segmented in a two-dimensional array of rows and columns. Each row and column of the two-dimensional array may be encoded with an error correcting code, such as a parity code. The data of each row and column of the two dimensional may be referred to as a codeword. The codeword may include one or more of user data, error correcting code, metadata, or other information. A codeword may be an encoded version of an original bit pattern stored on one or more memory devices. The two-dimensional array of rows and columns may be a logical representation of the data block. Each row and column of the two dimensional array may have a logical association with the physical non-volatile memory. The intersections between a row and a column may include an overlap region where a particular row and column overlap. Each overlap region may include a set of bits of data.

In performing error correcting code operations, encoded data stored on the storage device may be transmitted from the storage device to the controller during a decoding operation. The controller may perform decoding operations to decode the encoded data into the original sequence of bits that were encoded on the storage device. A number of bits of the decoded data received by the controller may have been flipped due to noise, interference, distortion, bit synchronization errors, or errors from the media itself (both intrinsic and extrinsic). For example, a bit that may have originally been stored as a 0 may be flipped to a 1 or vice versa.

Conventional storage devices may perform tiers of error correcting code operations to attempt to correct errors on data blocks. For example, a conventional storage device may perform a first tier of error correcting code operations (e.g., product code operations) on rows and columns of the two-dimensional array to detect and correct errors in the encoded data. For example, the rows and columns of the two-dimensional array may be decoded using an iterative process. Each row of the two-dimensional array may be decoded to produce a corresponding string of bits. Then, each column of the two-dimensional array may be decoded to produce a corresponding string of bits.

Generally, the error correcting code capability of a convention storage device is limited. The error correcting code that is encoded with each row and column of the two-dimensional array may correct a number of errors in the error correcting code's corresponding row or column that is less than or equal to the error correcting code's correction capability (also referred to as "t" herein). However, if the number of errors in the corresponding row or column is greater than the error correcting code's correction capability, then the error correcting code may not be able to correct the errors of the corresponding row or column, resulting in an unsuccessful correction of errors. For example, if an error correcting code has a correction capability of 4 errors and a row or column of the data block contains 4 errors, then the error correcting code may correct the 4 errors of the row or column. However, if the error correcting code has a correction capability of 4 errors and a row or column of the array contains 5 errors, then the error correcting code may not be able to correct the errors of the row or column, resulting in an unsuccessful decoding operation. The correction capability of the error correcting code may be proportional to a data size of the error correcting code. For example, an error correcting code having a correction capability of 3 errors may have a smaller data size than an error correcting code having a correction capability of 4 errors.

Errors that are present in an overlap region of a row and column of a two-dimensional array present particular challenges for conventional storage devices. For example, if the error correcting code has a correcting capability of 4 errors and 5 errors of the data block are located in the overlap region (e.g., stall pattern error), iterative error correcting code operations (e.g., one or more decoding operations) performed on rows or columns of the two-dimensional array may not be able to correct the 5 errors in the overlap region of the encoded data, which may result in an unsuccessful correction of an error of the data block. For example, the errors may be located in a region (e.g., overlap region) of the two-dimensional array so that no matter how many iterations of error correcting code operations, the number of errors in the region exceeds the correction capability of the error correcting code.

Generally, if the first tier of error correcting code operations results in an unsuccessful correction of an error of the data block, the controller of a conventional storage device may perform a second tier of error correcting code operations, such as Bose-Chaudhuri-Hocquenghem (BCH) code operations or Low Density Parity Code (LDPC), having a correction capability greater than the first tier of error correcting code operations (or a second tier of error correcting code operations that are not subject to the stall pattern's impact on correctability). The second tier of error correcting code operations may be performed to correct the error in the data block. Often, the performance of the second tier of error correcting code operations by conventional storage devices introduces additional latency. The additional latency may cause a time delay before the operation requested by the host system may be performed (e.g., read operation). In some instances, the latency introduced by the performance of the second tier of error correcting code operations is significantly greater than the latency introduce by the performance of the first tier of error correcting code operations. Reducing the frequency that the second tier of error correcting code operations is performed, and the accompanying latency, while still correcting the errors of the data block presents additional challenges for conventional storage devices.

Aspects of the disclosure address the above and other challenges by identifying an event associated with a data block, such as an event associated with error correcting code operations on the data block. Responsive to identifying the event, a processing device such as a SSD controller, may perform a remix operation to change the logical to physical association (hereinafter also referred to as "logical association" or "logical representation" herein) of the data block from a first logical association to a second logical association. In embodiments, changing from a first logical association to a second logical association includes receiving data, such as codewords, from one or more media devices and changing the manner in which a decoder interprets the data (e.g., changing the order that the decoder receives the data).

For example, the controller of the storage device may perform a first tier of error correcting code operations on a data block. The first tier of error correcting code operations may correct errors in rows and columns having a number of errors less than or equal to the correcting capability of the first tier of error correcting code operations. If any of the rows or columns of the data block contain more errors than the correcting capability of the first tier of error correcting code operations, then the decoding of those rows or columns may result in an unsuccessful correction of the errors. The controller may then identify any sets of bits of the data block that caused the unsuccessful correction of the errors. The unsuccessful correction of errors of any of the sets of bits of the data block may trigger the initiation of a second tier of error correcting code operations. The second tier of error correcting code operations may have a correction capability greater than the first tier of error correcting code operations. The second tier of error correcting code operations may correct the errors of the data block. The controller may perform a remix operation on the data block to change the logical to physical association from a first logical association to a second logical association. The remix operation may allow the controller to correct the errors that were previously uncorrectable in the first tier of error correcting code operations to be corrected by a subsequent performance of the first tier of error correcting code operations. The change in logical to physical association logically reorders the placement of errors in different regions in a two-dimensional array in a manner that errors in the regions are less than or equal to the correcting capability of the first tier of error correcting code operations. In some implementations, the remix operation may be implemented by retrieving data from physical memory in a different order and sending the data to a decoder for decoding in the order retrieved.

Changing the logical to physical association of the data block from an initial logical association to a new logical association may logically redistribute the errors in the data block. With the new logical association of the data block, errors associated with the initial logical association of the data block that were previously uncorrectable by the first tier of error correcting code operations may be redistributed in a manner that allows the first tier of error correcting code operations to correct the errors. For instance, if the first tier of error correcting code operations has an error correction capability of 4 for each of the rows and columns of the two-dimensional array, 5 errors in an overlap region of a row and column of the two-dimensional array will result in an unsuccessful correction of the 5 errors. If the 5 errors are redistributed in the data block so that 2 of the 5 errors are redistributed in a first overlap region and 3 of the 5 errors are redistributed in a second overlap region, the error correction capability (t=4) of the first tier of error correcting code operations is sufficient to correct the errors of the data block.

Performing a remix operation on the data block to change the logical to physical association of the data block from an original logical association to a different logical association may improve the performance of the storage device by, for example, reducing latency of the storage device, and reduces the computational (processing) resources used by a SSD controller as the second tier of error correcting code operations may be performed less frequently after the changing of the logical to physical association.

It may be noted that for purposes of illustration, rather than limitation, embodiments herein may be described with respect to non-volatile memory. I may be noted that that in other embodiments, aspects of the present disclosure may be applied to volatile media, such as volatile media that uses error correcting code (e.g., volatile media that exhibits error clustering or error rates high enough to warrant the use of error correcting code). It may also be noted that error correcting code operations may include one or more operation for error detection, error correction, or both.

FIG. 1 illustrates an example computing environment 100 that includes a storage device 110. In general, the computing environment 100 may include a host system 120 that uses the storage device 110. For example, the host system 120 may write data to the storage device 110 and read data from the storage device 110.

The host system 120 may be one or more computing devices such as a desktop computer, laptop computer, network server, mobile device, or such computing device that includes a memory and a processing device. The host system 120 may include or be coupled to the storage device 110 so that the host system 120 may read data from or write data to the storage device 110. For example, the host system 120 may be coupled to the storage device 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface may be used to transmit data between the host system 120 and the storage device 110. In embodiments, the host system 120 may implement a physical host interface using NVM Express (NVMe) or aspects of Non-Volatile Memory Host Controller Interface Specification (NVMHCIS), which is an open logical device interface specification for accessing non-volatile storage media attached via a PCI Express (PCIe) bus.

As shown in FIG. 1, the storage device 110 may include a controller 111 and memory devices 112A to 112N. In some embodiments, controller 111 may be an SSD controller. In some embodiments, the memory devices 112A to 112N may be non-volatile memory. For example, the memory devices 112A to 112N may be a negative-and (NAND) type flash memory. Each of the memory devices 112A to 112N may include one or more arrays of memory cells such as single level cells (SLCs) (e.g., where 1 bit of information is stored in an individual memory cell), multi-level cells (MLCs)(e.g., where more than 1 bit of information is stored in an individual memory cell), triple-level cells (TLCs) (e.g., where 3 bit of information is stored in an individual memory cell), or quad-level cells (QLCs) (e.g., where 4 bit of information is stored in an individual memory cell). Each of the memory cells may store bits of data (e.g., data blocks) used by the host system 120. Although non-volatile memory devices such as NAND type flash memory are described, the memory devices 112A to 112N may be based on any other type of memory. For example, the memory devices 112A to 112N may be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, and electrically erasable programmable read-only memory (EEPROM). In one embodiment, memory devices 112A-112N may be a cross-point array of non-volatile memory cells. Cross-point non-volatile memory may perform bit storage based on a change of bulk resistance, in conjunction with a stackable cross-gridded data access array. Additionally, cross point non-volatile memory may perform a write in-place operation (in contrast to many Flash-based memory), where a non-volatile memory cell may be programmed without the non-volatile memory cell being previously erased. Furthermore, the memory cells of the memory devices 112A to 112N may be grouped as memory pages or data blocks that may refer to a unit of the memory device used to store data.

The controller 111 may communicate with the memory devices 112A to 112N to perform operations such as reading data, writing data, or erasing data at the memory devices 112A to 112N and other such operations. The controller 111 may include hardware such as one or more integrated circuits and/or discrete components, memory, software such as firmware or other instructions, or a combination thereof. In general, the controller 111 may receive commands or operations from the host system 120 and may convert the commands or operations into instructions or appropriate commands to achieve the desired access to the memory devices 112A to 112N. The controller 111 may be responsible for other operations such as wear leveling operations, garbage collection operations, error detection and error correcting code (ECC) operations, encryption operations, caching operations, and address translations between a logical block address and a physical block address that are associated with the memory devices 112A to 112N.

Referring to FIG. 1, the controller 111 may include a remix component 113 to perform a remix operation to vary the logical to physical association of a data block from a first logical association to a second logical association. The controller 111 may identify an instance of an event of interest (hereinafter referred to as an "event") and responsive to identifying the event, perform the remix operation. For example, the remix component 113 may perform a first set of error correcting code operations on the data block, such as one or more decoding operations to detect and correct an error. It may be noted that a set or tier of error correcting code operations may include one or more operations. The remix component 113 may also determine that the first set of error correcting code operations is associated with an unsuccessful correction of the error. For example, if the error correcting code operations have a correction capability of 4 errors and a set of bits of the identified data block contains 5 errors, then the remix component 113 may determine that the first set of error correcting code operations is associated with an unsuccessful correction of an error. Responsive to determining the first set of error correcting code operations is associated with an unsuccessful correction of the error, remix component 113 may perform or trigger a second set of error correcting code operations (e.g., fail over error correcting code) having a greater correction capability than the first set of error correcting code operations. If the error is corrected using the second set of error correcting code operations, remix component 113 identifies the event (e.g., first set of error correcting code operations fails to correct the error, and the second set of error correcting code operations corrects the error) and performs a remix operation to change the logical to physical association of the data block. Further details with regards to the operations of the remix component 113 are described below.

The storage device 110 may include additional circuitry or components that are not illustrated. For example, the storage device 110 may include a cache or buffer (e.g., DRAM) and address circuitry (e.g., a row decoder and a column decoder) that may receive an address from the controller 111 and decode the address to access the memory devices 112A to 112N.

Figure 2:
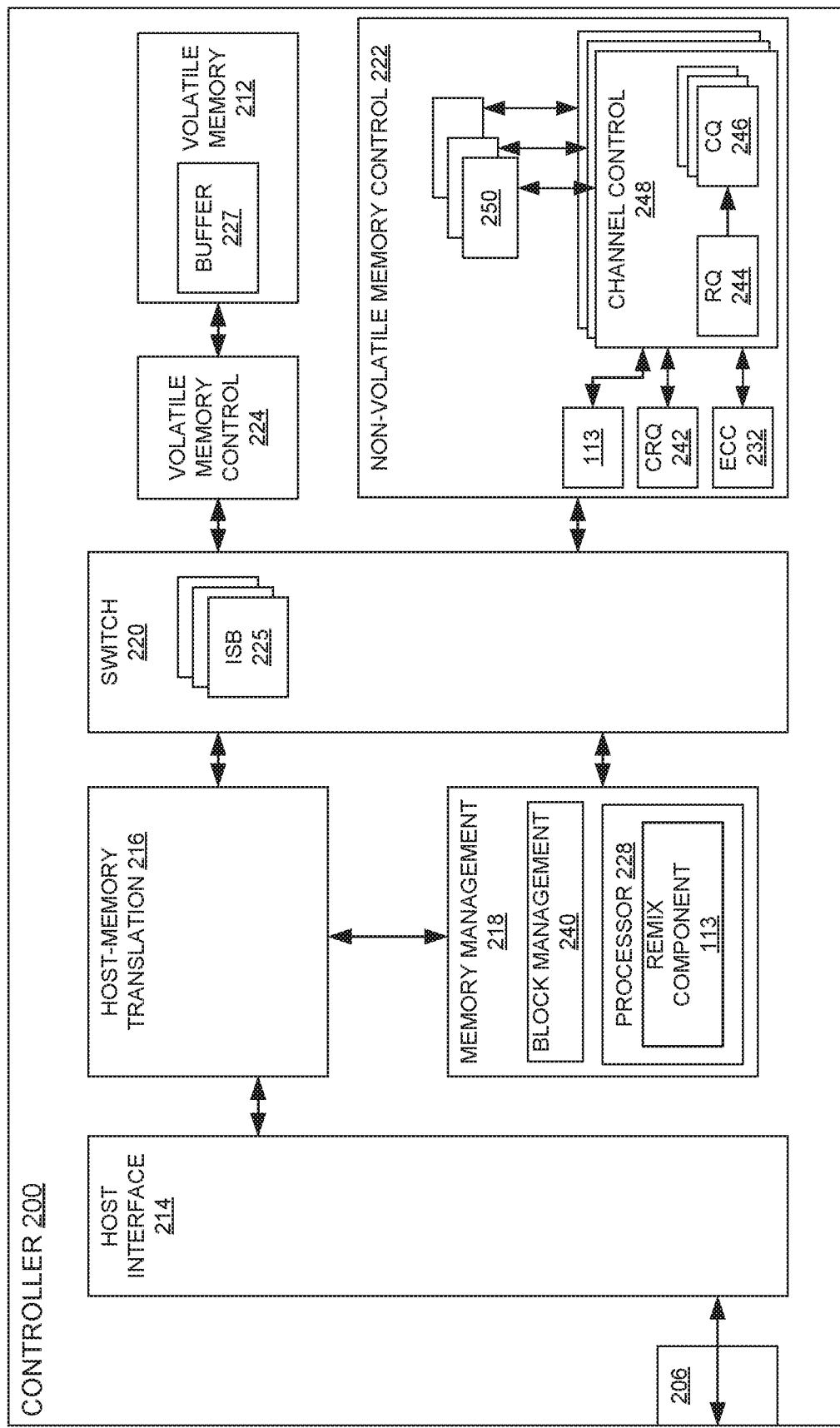
FIG. 2 is a block diagram of an example controller of the storage device, in accordance with some embodiments of the disclosure.

FIG. 2 is a block diagram of an example controller 200 of a storage device. In general, the controller 200 may correspond to the controller 111 of FIG. 1.

As shown in FIG. 2, a non-volatile memory may include a number of memory units 250 and the controller 200 may include a volatile memory 212. A memory unit 250 may be a portion (e.g., a memory page, physical data block, a die of a memory device, etc.) of non-volatile memory that may be independently controllable by the controller 200. The controller 200 may include a host interface circuitry 214 to interface with a host system via a physical host interface 206. The controller may further include host-memory translation circuitry 216, memory management circuitry 218, switch 220, non-volatile memory control circuitry 222, and/or volatile memory control circuitry 224.

The host interface circuitry 214 may be coupled to host-memory translation circuitry 216. The host interface circuitry 214 may interface with a host system. In general, the host interface circuitry 214 may be responsible for converting command packets received from the host system into command instructions for the host-memory translation circuitry 216 and for converting host-memory translation responses into host system commands for transmission to the requesting host system.

Referring to FIG. 2, the host-memory translation circuitry 216 may be coupled to the host interface circuitry 214, to the memory management circuitry 218, and/or to the switch 220. The host-memory translation circuitry 216 may be configured to translate host addresses to memory addresses (e.g., addresses associated with a received command such as a read and/or write command from the host system). For example, the host-memory translation circuitry 216 may convert logical block addresses (LBAs) specified by host system read and write operations to commands directed to specific memory units 250 (e.g., physical block addresses). The host-memory translation circuitry 216 may include error detection and correcting circuitry, such as exclusive or (XOR) circuitry that may calculate parity information based on information received from the host interface circuitry 214.

The memory management circuitry 218 may be coupled to the host-memory translation circuitry 216 and the switch 220. The memory management circuitry 218 may control a number of memory operations including, but not limited to, initialization, wear leveling, garbage collection, reclamation, and/or error detection and correcting. While the memory management circuitry 218 may include a processor 228, a number of embodiments of the disclosure provide for control of memory operations in circuitry (e.g., without relying on the execution of instructions such as software and/or firmware) by the processor 228. Memory management circuitry 218 may include block management circuitry 240 to retrieve data from the volatile memory 212 and/or memory units 250 of non-volatile memory. For example, the block management circuitry 240 may retrieve information such as identifications of valid data blocks of the memory units 250, erase counts, and other status information of the memory units 250 to perform memory operations.

The switch 220 may be coupled to the host-memory translation circuitry 216, the memory management circuitry 218, the non-volatile memory control circuitry 222, or the volatile memory control circuitry 224. The switch 220 may include or be coupled to a number of buffers. For example, the switch 220 may include internal static random access memory (SRAM) buffers (ISBs) 225. The switch may be coupled to DRAM buffers 227 that are included in the volatile memory 212. In some embodiments, the switch 220 may provide an interface between various components of the controller 200. For example, the switch 220 may account for variations in defined signaling protocols that may be associated with different components of the controller 200 in order to provide consistent access and embodiment between different components.

The non-volatile memory control circuitry 222 may store information corresponding to a received read command at one of the buffers (e.g., the ISBs 225 or the buffer 227). Furthermore, the non-volatile memory control circuitry 222 may retrieve the information from one of the buffers and write the information to a corresponding memory unit 250 of the non-volatile memory. The number of memory units 250 may be coupled to the non-volatile memory control circuitry 222 by a number of channels. In some embodiments, the number of channels may be controlled collectively by the non-volatile memory control circuitry 222. In some embodiments, each memory channel may be coupled to a discrete channel control circuit 248. A particular channel control circuit 248 may control and be coupled to more than one memory unit 250 by a single channel.

As shown in FIG. 2, the non-volatile memory control circuitry 222 may include a channel request queue (CRQ) 242 that is coupled to each of the channel control circuits 248. Furthermore, each channel control circuit 248 may include a memory unit request queue (RQ) 244 that is coupled to multiple memory unit command queues (CQs) 246. The CRQ 242 may be configured to store commands (e.g., write requests or read requests) shared between channels, the RQ 244 may be configured to store commands between the memory units 250 on a particular channel, and the CQ 246 may be configured to queue a current command and a next command to be executed subsequent to the current command.

The CRQ 242 may be configured to receive a command from the switch 220 and relay the command to one of the RQs 244 (e.g., the RQ 244 associated with the channel that is associated with the particular memory unit 250 for which the command is targeted). The RQ 244 may be configured to relay a first number of commands for a particular memory unit 250 to the CQ 246 that is associated with the particular memory unit 250 in an order that the first number of commands were received by the RQ 244. A command pipeline may be structured such that commands to a same memory unit 250 move in a particular order (e.g., in the order that they were received by the RQ 244). The RQ 244 may be configured to queue a command for a particular memory unit 250 in response to the CQ 246 associated with the particular memory unit 250 being full and the CRQ 242 may be configured to queue a command for a particular RQ 244 in response to the particular RQ 244 being full.

The RQ 244 may relay a number of commands for different memory units 250 to the CQs 246 that are associated with the different memory units 250 in an order according to a status of the different memory units 250. For example, the status of the different memory units 250 may be a ready or busy status. The command pipeline is structured such that the commands between different memory units 250 may move out of order (e.g., in an order that is different from the order in which they were received by the RQ 244 according to what is efficient for overall memory operation at the time). For example, the RQ 244 may be configured to relay a first one of the second number of commands to a first CQ 246 before relaying a second command from the second number of commands to a second CQ 246 in response to the status of the different memory unit 250 associated with the second CQ 246 being busy, where the first command is received later in time than the second command. The RQ 244 may be configured to relay the second command to the second CQ 246 in response to the status of the memory unit 250 associated with the second CQ 246 being ready (e.g., subsequent to relaying the first command).

In some embodiments, the control circuits for each channel may include discrete error detection and correcting circuitry 232 (i.e., error correcting code (ECC) circuitry), coupled to each channel control circuit 248 or a number of error detection and correcting circuits 232 that can be used with more than one channel. The error detection and correcting circuitry 232 may be configured to apply error correcting operations, such as product code operations, to detect and correct errors associated with information stored in the memory units 250. The error detection and correcting circuitry 232 may be configured to provide differing error correcting schemes for SLC, MLC, TLC, or QLC operations. The non-volatile memory control circuitry 222 may further include the remix component 113 of FIG. 1 to perform one or more decoding operations on a particular memory device corresponding to one of the memory units 250. In some embodiments, remix component 113 may be part of processor 228.

Figure 3A:
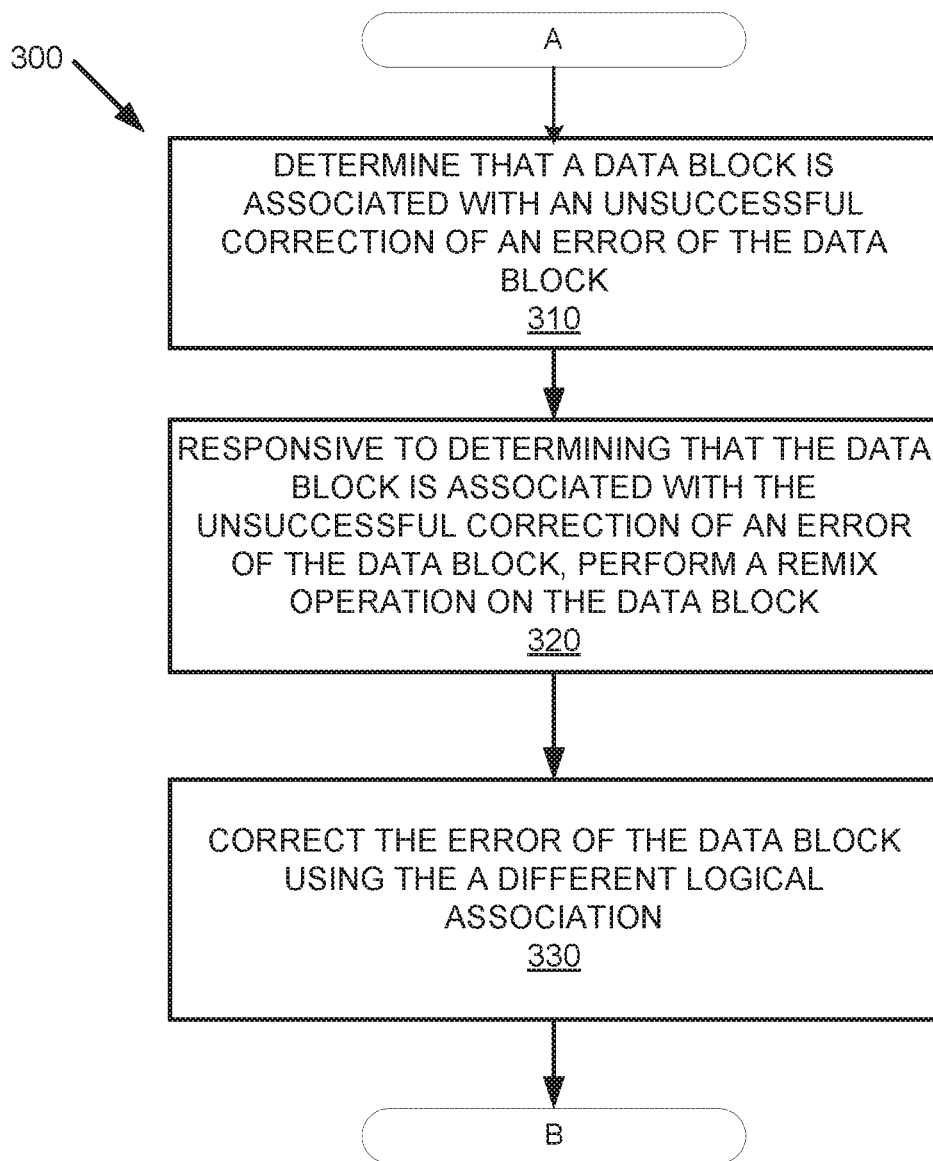
FIG. 3A is a flow diagram of an example method to perform a remix operation on a data block and correct the error, in accordance with some embodiments.

FIG. 3A is a flow diagram of an example method to perform a remix operation on a data block and correct an error in the data block, in accordance with some embodiments. The method 300 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 may be performed by the remix component 113 of the controller 111 of FIG. 1. It may be noted that in other embodiments, method 300 may include the same, different, additional, or fewer operations performed in the same or different order.

At block 310, processing logic determines the data block is associated with an unsuccessful correcting of an error of the data block. It may be noted that the error may be determined using a number of ways, such as a parity check, a first tier of error correcting code operations, etc. In an example where a first tier of error correcting code operations is used, an unsuccessful correcting of an error can occur when a row or column of the data block contains a greater number of errors than the correction capability of the error correcting code of the first tier of error correcting code operations. For example, if a row contains 5 errors and the correction capability of the error correcting code is 4, then the row may cause an unsuccessful correction of an error in the row. It may be noted the correction capability of an error correcting code may be determined from the size of the error correcting code (e.g., number of bits) or be stored in memory.

In some embodiments, responsive to determining that the first tier of error correcting code operations on the data block is associated with an unsuccessful correction of the error of the data block, processing logic may perform a second tier of error correcting code operations on the data block to correct the error. The second tier of error correcting code operations is different from the first tier of error correcting code operations. The second tier of error correcting code operations may have a greater correction capability than the first tier of error correcting code operations. For example, the first tier of operations may be product code operations and the second tier of operation may be BCH operations (e.g., BCH decoding operations). The second tier of error correcting code operations on the data block may be associated with a successful correction of the error of the data block.

At block 320, responsive to determining that the data block is associated with the unsuccessful correction of the error of the data block, processing logic performs a remix operation on the data block to change a logical to physical association of the data block from a first logical association to a second logical association. For example, the two-dimensional array of rows and columns may be a logical representation of the data block (e.g., first logical representation). The rows and columns of two-dimensional array have a first logical association with the non-volatile memory (e.g., has a particular mapping to physical addresses of the non-volatile memory). In performing the remix operation, processing logic can change the data block from the first logical association to a second logical association.

Figure 3B:
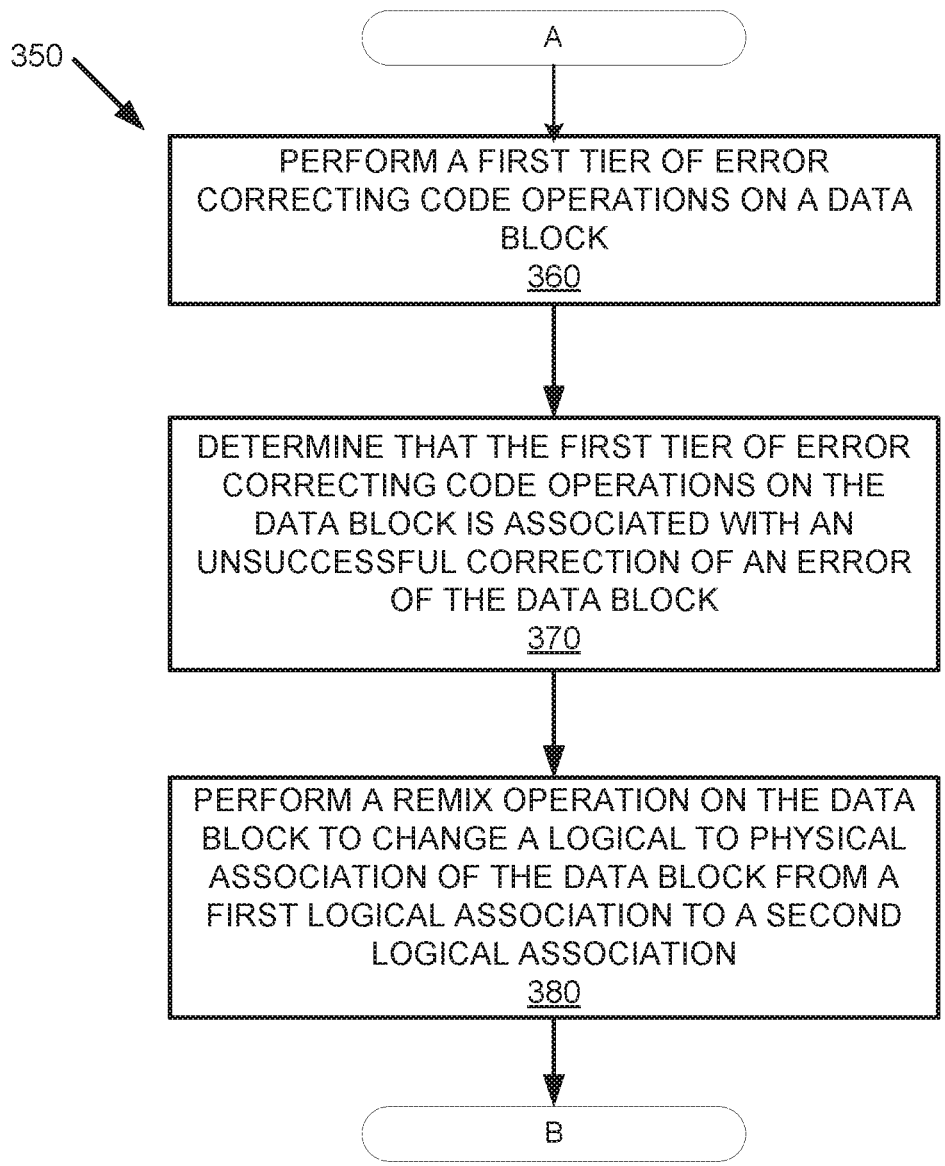
FIG. 3B is a flow diagram of an example method to perform a remix operation on a data block to change the logical to physical association of the data block from a first logical association to a second logical association, in accordance with some embodiments.

At block 330, processing logic may correct the error of the data block using the second logical association. It may be noted that in some implementations, that the error may have been originally uncorrectable using the first tier of error correcting code operations on the data block having the first logical association. A second tier of error correcting code operations may be used to correct the error. In some implementations, subsequent to the correction of the error using the second tier of error correcting code, a remix operation may be performed to change the logical association of the data block to the second logical association. In some embodiments, new codewords may be encoded for the second logical association of the data block, and in a subsequent operation on the data block the error (that was previously uncorrectable using the first tier of error correcting code operations on the data block having a first logical association) is correctable using the first tier of error correcting code operations on the data block having the second logical association. FIG. 3B is a flow diagram of an example method 350 to perform a remix operation on a data block to change the logical to physical association of the data block from a first logical association to a second logical association, in accordance with some embodiments. The method 350 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 350 may be performed by the remix component 113 of the controller 111 of FIG. 1. It may be noted that in other embodiments, method 350 may include the same, different, additional, or fewer operations performed in the same or different order.

At block 360, processing logic performing method 350 performs a first tier of error correcting code operations on a data block. The data block may be a two-dimensional array of rows and columns (e.g., first logical representation) that is stored on a storage device. Each row and column may include an encoded error correcting code (e.g., parity code) that is capable of correcting a particular number of errors (e.g., correction capability). For example, each row and column may be encoded with an error correcting code having a correction capability of 4. Accordingly, the error correcting code may be capable of correcting 4 errors (corresponding to four bits) in a corresponding row or column. In one embodiment, the first tier of error correcting code operations may be product code operations. The error correcting code operations (e.g., product code operations) may include one or more decoding operations to correct errors of the data block. For example, decoding operations may attempt to translate the encoded data (e.g., codeword) into an original string of bits that were encoded onto the storage device. During the decoding process, decoding operations may correct a number of errors from the rows and columns up to the number of error-correcting codes correcting capability. For example, if a row has 3 errors and the error correcting code of the decoding operation has a correcting capability of 4, then the 3 errors of the row may be corrected by the decoding operation. It may be noted that the correction capability of rows and columns may be symmetric, as described above, or asymmetric. For example, the column orientation may have a correction capability of 4 and the row orientation may have a correction capability of 5.

At block 370, processing logic determines that the first tier of error correcting code operations on the data block is associated with an unsuccessful correcting of an error of the data block. An unsuccessful correcting of an error can occur when a row or column of the data block contains a greater number of errors than the correction capability of the error correcting code of the first tier of error correcting code operations. For example, if a row contains 5 errors and the correction capability of the error correcting code is 4, then the row may cause an unsuccessful correction of an error in the row. It may be noted the correction capability of an error correcting code may be determined from the size of the error correcting code (e.g., number of bits) or be stored in memory.

In some embodiments, responsive to determining that the first tier of error correcting code operations on the data block is associated with an unsuccessful correction of the error of the data block, processing logic may perform a second tier of error correcting code operations on the data block. The second tier of error correcting code operations is different from the first tier of error correcting code operations. The second tier of error correcting code operations may have a greater correction capability than the first tier of error correcting code operations. For example, the first tier of operations may be product code operations and the second tier of operation may be BCH operations (e.g., BCH decoding operations). The second tier of error correcting code operations on the data block may be associated with a successful correction of the error of the data block.

At block 380, responsive to determining that the first tier of error correcting code operations on the data block is associated with the unsuccessful correction of the error of the data block, processing logic performs a remix operation on the data block to change a logical to physical association of the data block from a first logical association to a second logical association. For example, the two-dimensional array of rows and columns may be a logical representation of the data block (e.g., first logical representation). The rows and columns of two-dimensional array have a first logical association with the non-volatile memory (e.g., has a particular mapping to physical addresses of the non-volatile memory). In performing the remix operation, processing logic can change the data block from the first logical association to a second logical association.

In some embodiments, the remix operation redistributes the errors in the two-dimensional array to different areas of the two-dimensional array, which allows improved performance of the first tier of error correcting code operations. For example, the error of the data block may be a stall pattern error. A stall pattern or stall pattern error may refer to a minimum number of array positions which, when all received in error, cause the decoder to stall (e.g., further column and row decodes do not correct the errors). For example, if the number of errors (e.g., 5 errors) in the overlap region of a row and a column of the two-dimensional array exceeds the error correction capability of the row and column (e.g., error correction capability of 4), further column and row decodes will not correct the errors. The errors (e.g., 5 errors) in the overlap region represent a stall pattern or stall pattern errors. By changing the logical associations of the two-dimensional array, the errors can be redistributed to different array positions to eliminate a stall pattern error by reducing the number of errors in the overlap region of a row and a column of the two-dimensional array to not exceed the error correction capability of the row and column, and allow the first tier of error correcting code operations to correct the errors of the data block.

For example, in the first logical association the error (e.g., 5 errors) in the overlap region is not corrected using the first tier of error correcting code operations. A second tier of error correcting code operations may be performed to correct the error in the overlap region. The remix operation may be performed prior to or without performing the second tier of error correcting code operations to change the logical association of the data block from the first logical association to a second logical association. In the second logical association, the overlap region, which previously had 5 errors in the first logical association, now has a reduced number of errors (e.g., 3 errors) because of the remix operation. The first tier of error correcting code operations (e.g., error correction capability of 4) can be performed using the second logical association to correct all the errors (e.g., 3 errors) of the second logical association of the data block, without using the second tier of error correcting code operations.

Figure 4A:
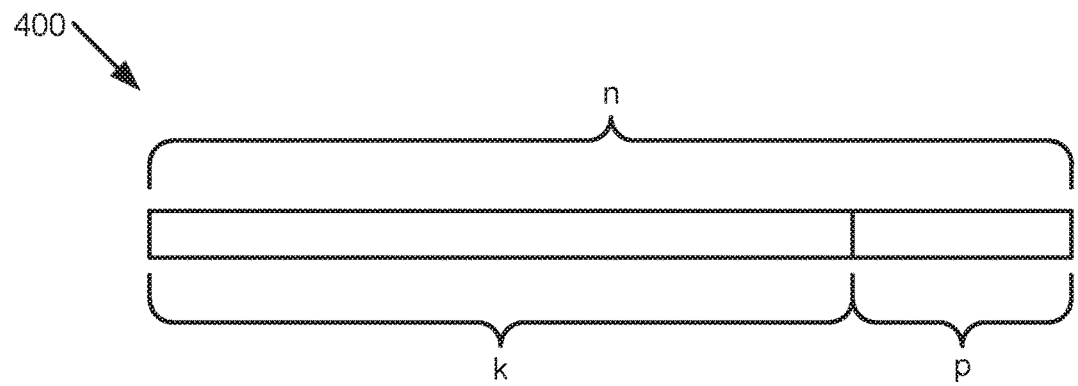
FIG. 4A illustrates an example of a data block of a storage device, in accordance with some embodiments of the disclosure.

FIG. 4A illustrates an example of a data block 400 of a storage device, in accordance with some embodiments. In some embodiments, data block 400 may be decoded by remix component 113 of controller 111 of FIG. 1. Data block 400 may be representative of user data stored on a storage device. Data block 400 may include user data (k) of a particular size that has been encoded and stored on the storage device. The size can be represented by a bit size. For example, the user data may have a data size of 6400 bits. Data block 400 may also include error correcting code (p) (e.g., parity code or other type of error correcting code) that also has a particular size. For example, error correcting code may have a data size of 600 bits. The error correcting code may have a correcting capability (t) that indicates the number of errors the error correcting code is able to correct during a decoding operation. As previously discussed, the data size of the error correcting code may correspond to the correcting capability of the error correcting code. For example, an error correcting code having a correcting capability of t=4 may have a larger data size than an error correcting code having a correcting capability of t=3. Data block 400 may have a total block size (n) that is the total of both the user data (k) and the error correcting code (p). In some embodiments, the total block size may also include metadata (not shown). For example, if the user data has a size of 6400 bits and the error correcting code has a size of 600 bits, then the data block 400 may have a total block size of 7000 bits.

Figure 4B:
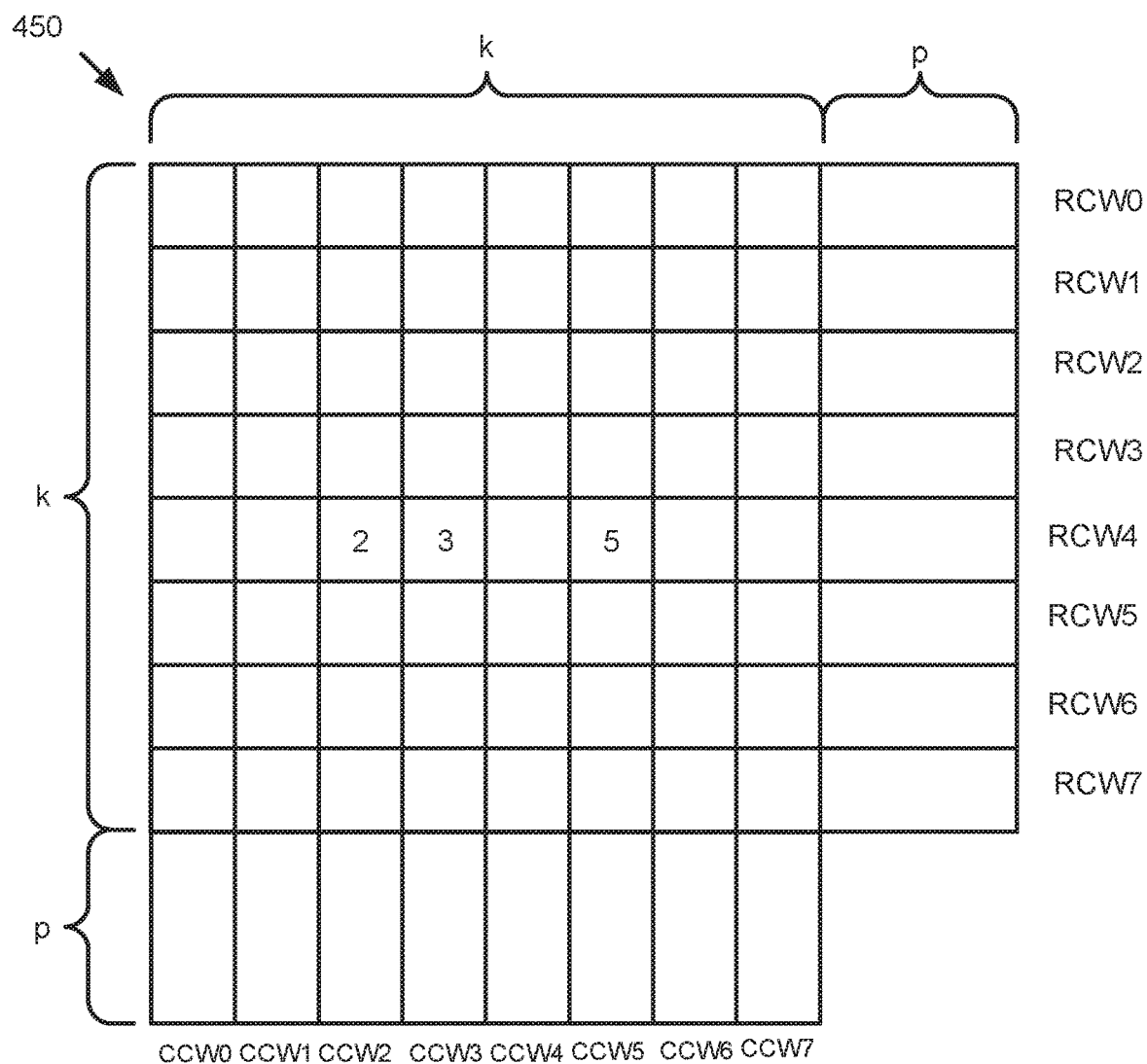
FIG. 4B illustrates an example of a logical association of a data block and product code error correcting code operations on a data block, in accordance with embodiments of the disclosure.

FIG. 4B illustrates an example of a logical association of a data block and product code error correcting code operations on a data block, in accordance with some embodiments of the disclosure. In embodiments, data block logical representation 450 (also referred to as "logical association" herein) may be a product code representation of the data block 400. Data block logical representation 450 is a logical representation of data block 400 illustrated as a two-dimensional array of rows and columns. Each row corresponds to a row codeword (e.g., RCW0-RCW7), and each column corresponds to a column codeword (e.g., CCW0-CCW7).

The data block logical representation 450 may include user data (k) (and in some cases, error correcting code (p)) of data block 400. However, rather than being encoded as a single string of bits of data, as illustrated in FIG. 4A, the user data (k) may be encoded into a logical array of rows and columns, as illustrated in FIG. 4B. For example, if the user data has a data size of 6400 bits, then the 6400 bits may be encoded into data block logical representation 450 having 8 rows and 8 columns each being 80 bits, as illustrated in FIG. 4B. Although data block logical representation 450 may be illustrated as having an equal number of rows and columns, in other embodiments data block logical representation 450 may contain various geometries formed of differing numbers of rows and columns.

Each row and column of data block logical representation 450 may be encoded with a corresponding error correcting code (p), as previously discussed. Furthermore, each row and column may be divided into various regions (e.g., overlap regions) that overlap each other, where each overlap region includes a set of bits, illustrated as boxes in FIG. 4B. Using the previous example, a row consisting of 80 bits may have 8 overlap regions (e.g., 8 sets of bits) that intersect the columns, where each overlap region includes 10 bits. The error correcting code may have a correction capability (t) that corresponds to a number of errors the error correcting code may be able to correct in the error correcting code's corresponding row or column during a decoding operation. For example, if an error correcting code for a row has a correcting capability of t=4, then the error correcting code may correct up to 4 errors in that row.

During a decoding operation of the error correcting code operations, the processing device may store status bits (not shown) that correspond to whether that particular row or column has at least one set of bits that are associated with an unsuccessful correction of an error. For example, if a row or column of data block logical representation 450 does not have any sets of bits that caused an unsuccessful correction of an error, then the processing device may set a status bit that corresponds to that particular row or column to read a value of 1. Conversely, if a row or column of data block logical representation 450 has at least one set of bits that caused an unsuccessful correction of an error, then the processing device may set a status bit 460 that corresponds to that particular row or column to read a value of 0.

During the decoding operations of the error correcting code operations, the processing device may iteratively decode the rows and columns of data block logical representation 450. For example, the processing device may first decode all the rows of the array followed by all the columns of the array, or vice versa. During the decoding operation, some sets of bits may include a number of errors. In the present illustration, data block logical representation 450 includes 3 sets of bits that contain a number of errors. One set of bits contains 2 errors, one set of bits includes 3 errors, and another set of bits includes 5 errors. In the present illustration, the error correcting code may have a correction capability of t=4. As each row of the first four rows (e.g., RCW0 to RCW3) of the data block logical representation 450 is decoded, the processing device may store the status bit as a 1 for each of the first four rows, which indicates that none of the sets of bits for a respective row is associated with an unsuccessful decoding operation. During the decoding operations the processing device may begin decoding the fifth row (RCW4) that includes the set of bits containing 2 errors, the set of bits containing 3 errors, and the set of bits containing 5 errors, resulting in a total number of errors for the fifth row being 10 errors. Because the total number of errors (e.t., 10 errors) for the fifth row is greater than the correction capability (e.g., t=4) of the error correcting code, at least one set of bits in the fifth row can cause an unsuccessful correction of an error. Accordingly, the processing device can store the status bit for the fifth row as a 0, indicating that at least one of the sets of bits in the fifth row caused or is likely to cause an unsuccessful correction of an error.

Following the decoding of the rows of the array, the processing device can decode each of the columns of the array of data block logical representation 450. During the decoding operation, the processing device may decode the third column (CCW2) from the left of the array that includes the set of bits containing 2 errors. Because the total number of errors (e.g., 2) for the particular column is less than the correction capability of the column's error correcting code (e.g., t=4) the decoding operation can successfully correct the 2 errors in the set of bits in that particular column. After successful correction of the 2 errors in the set of bits, the processing device can store the status bit for the third column as a 1, indicating that no sets of bits in the third column caused an unsuccessful correction of an error. Similarly, when the processing device decodes the fourth column (CCW3) from the left of the array it can correct the 3 errors in the set of bits in the particular column, and store the status bit for the fourth column as a value of 1. However, the sixth column (CCW5) from the left of the array contains 5 errors. Because the total number of errors (e.g., 5 bits have errors) for the particular column is greater than the correction capability of the column's error correcting code (e.g., t=4), the set of bits containing 5 errors is likely to cause an unsuccessful correction of an error. The 5 errors in the overlap region of the sixth column (CCW5) and the fifth row (RCW4) represents a stall pattern error (e.g., a minimum number of array positions which, when all received in error, cause the decoder to stall) where further column and row decodes will not correct the error. The processing device can store the status bit for the sixth column as a 0 to indicate that the sixth column is associated with an unsuccessful correction of an error.

Figure 5:
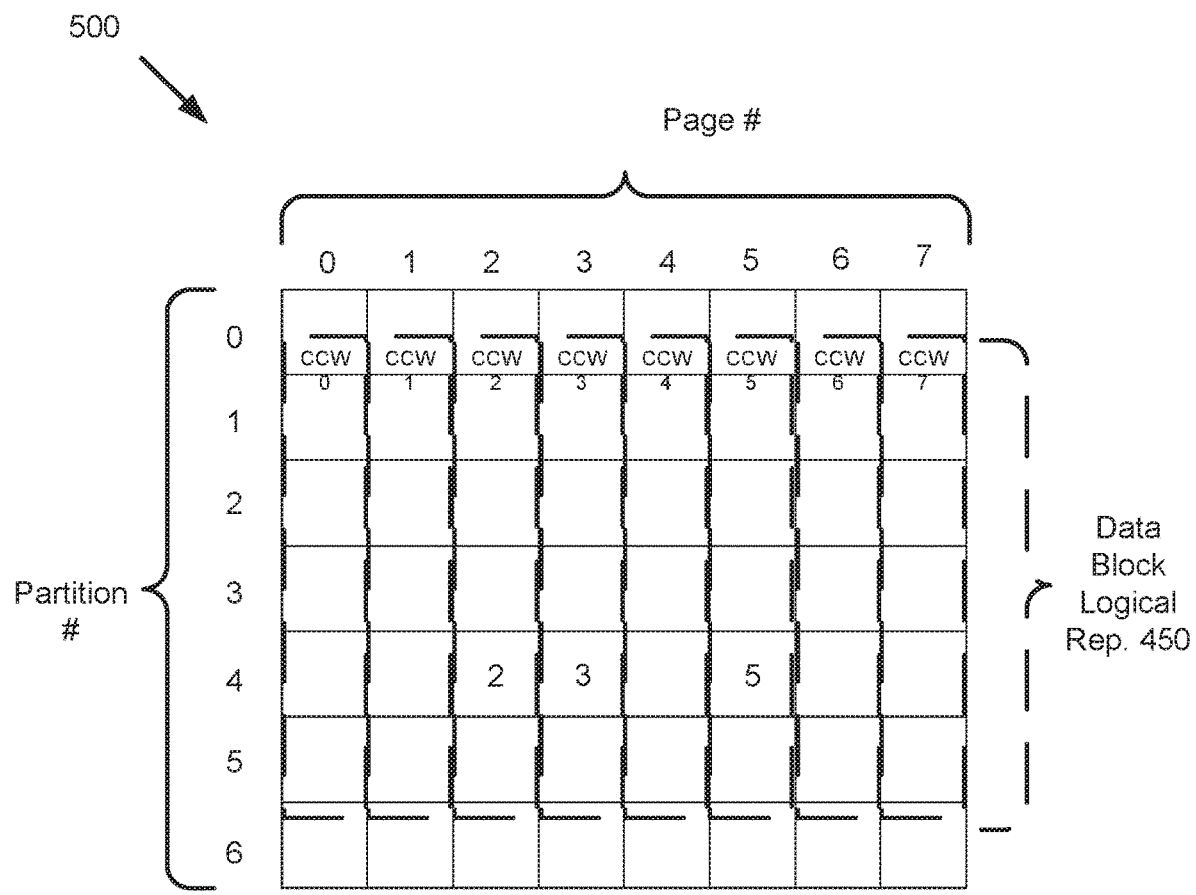
FIG. 5 illustrates an example of a logical to physical association of a data block overlaid on physical memory, in accordance with some embodiments of the disclosure.

FIG. 5 illustrates an example of a logical to physical association of a data block overlaid on physical memory, in accordance with some embodiments of the disclosure. An example block diagram representing physical memory 500 shows columns 0-7 that represent pages 0-7 of the physical memory 500. A page may be a unit of read or write of the physical memory 500 (e.g., fundamental unit of access) and have a physical address (e.g. page address or canonical address on a partition of a die). Physical memory 500 shows rows 0-6 that represent partitions of physical memory 500. A partition may be a unit of physical memory that contains one or more pages. In some embodiments, partitions may be accessed in parallel. Data block logical representation 450 of FIG. 4B is a logical representation of data block 400 FIG. 4A. Data block logical representation 450 of FIG. 4B is shown as an overlay to the physical memory 500 in FIG. 5 in a first logical association with physical memory 500. Each of the column codewords (CCW0-CCW7) in the data block logical representation 450 is logically mapped to physical memory 500, which can result in a mapping of the errors in the logical representation to the pages and/or partitions of the physical memory 500. For example, page 2 at partition 4 contains 2 errors, page 3 at partition 4 contains 3 errors, and page 5 at partition 4 contains 5 errors. The aforementioned errors are the same errors as illustrated in FIG. 4B. It may be noted that the cells of the physical memory 500 that are shown without codewords may contain other data such as row and column error correcting codes (e.g., parity codes) or be unused.

Figure 6A:
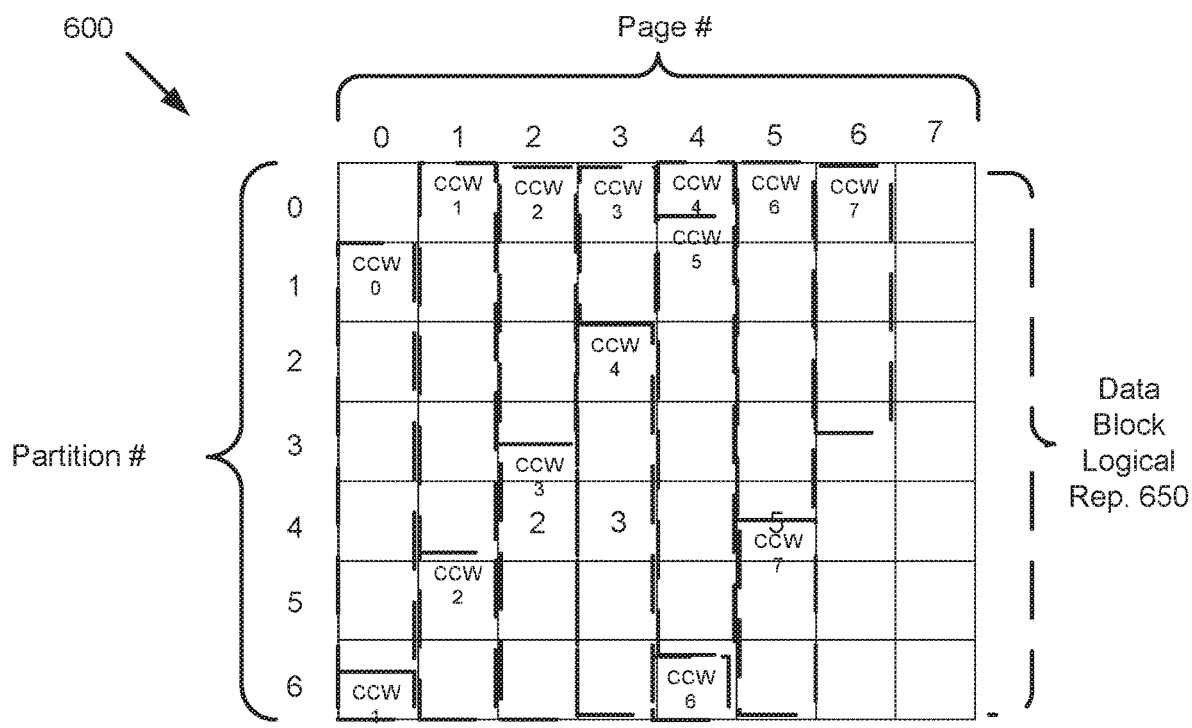
FIG. 6A illustrates an example of another logical to physical association of a data block overlaid on physical memory, in accordance with some embodiments of the disclosure.

FIG. 6A illustrates an example of another logical to physical association of a data block overlaid on physical memory, in accordance with some embodiments of the disclosure. An example block diagram is illustrated to represent physical memory 600, which can be the same as physical memory 500 of FIG. 5. Similar to physical memory 500, the errors 2, 3, and 5 are located in partition 4 in pages 2, 3, and 5, respectively. As illustrated in FIG. 6A, a remix operation changes the logical to physical association of data block logical representation 650 from the logical association (as illustrated as data block logical representation 450 in physical memory 500 of FIG. 5) to a new logical association in physical memory 600. Data block logical representation 650 is a new logical representation of data block 400 FIG. 4A and is different from the data block logical representation 450. Data block logical representation 650 is shown as an overlay to the physical memory 600 in a new logical association with physical memory 600. In the new logical association, the codewords as defined by data block logical representation 650 have been remapped from a previous logical association (e.g., logical association illustrated in FIG. 5) (also referred to as "first logical association") to the new logical association (also referred to as "second logical association"). For example, column codeword 1 (CCW1) has been remapped to begin on partition 6 of page 0. The subsequent column codewords (CCW2-CCW7) have been similarly remapped. Thus, the remapping from the first logical association to the second logical association may correspond to changing where a particular codeword (e.g., part of the codeword) begins and ends with respect to locations (e.g., particular partitions and pages) of the physical memory. The remapping may also indicate how individual bits from pages are combined into codewords. For example, if a stall pattern error exits because of an overlap region having 8 bits with 5 errors (with t=3 row and t=3 column), moving the same 8 bits to another overlap region may not allow the error to corrected using the first tier or error correcting code operations. The remix operation may break up the 8 bits and recombine the 8 bits in different overlap regions so that the first tier of error correcting code operations may correct the errors (e.g., the 2 of the 5 errors may move to a first overlap region and the remaining 3 errors of the 5 errors may move to a second overlap region).

As noted above, in some embodiments, changing from a first logical association to a second logical association includes receiving data, such as codewords, from one or more media devices and changing the manner in which a decoder interprets the data (e.g., changing the order that the decoder receives the data). For example, the rows and columns of the two-dimensional array may represent or indicate the order in which the decoder receives or decodes (or interprets) codewords. For instance, the decoder may receive and decode the CCW0, then receive and decode CCW1, then receive and decode CCW2, and so forth. In some embodiments, the remix operation is performed (to cause a change from a first logical association to a second logical association) by changing the order that the codewords or data of the codewords are sent to or received by the decoder. For example, to change the order that the data of the codewords are received by the decoder, the data (e.g., pages) may be read from memory in a different order (e.g., different order than the first logical association) and sent to a decoder in the different order. In another example, the data of the codewords may be read from memory in a same order, stored in a buffer, and the bits of the data shifted or moved, and decoded in the different order (due to the shifts or movement). In some examples, to shift or move the bits, a number of bits (less than the bit size of the overlap region) of a codeword may be moved or switched to a new position in the same codeword. In still other examples, rather than the sending the to the data of the codewords to the decoder in a different order, the decoder may effectively change the order of the codewords or the order of the data of the codewords, which changes the way the decoder interprets the data block.

Figure 6B:
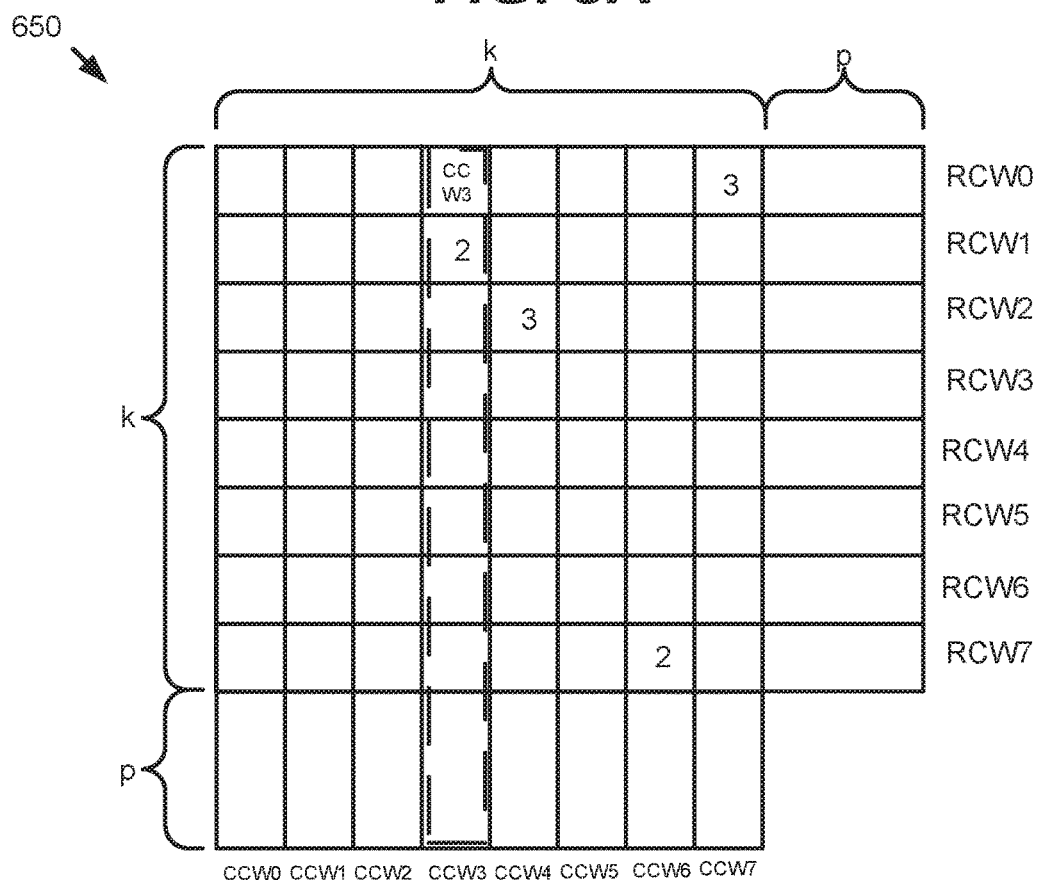
FIG. 6B illustrates an example of another logical association of a data block, in accordance with some embodiments of the disclosure.

FIG. 6B illustrates an example of another logical association of a data block, in accordance with some embodiments of the disclosure. Data block logical representation 650 is illustrated as a two-dimensional array of rows and columns. As illustrated, CCW3 which is mapped to the physical memory 500 in FIG. 6A is shown in the new data block logical representation 650 of FIG. 6B. The two-dimensional array is a logical representation of the data block 400 in FIG. 4A. Data block logical representation 650 may be similar to data block logical representation 450 of FIG. 4B, except that the logical association of data block logical representation 650 has a second logical association that is different than the logical association of data block logical representation 450.

In the second logical association, the errors are redistributed to different locations of data block 650. For example, the 2 errors in the overlap region of row codeword 1 (RCW1) and column codeword 3 (CCW3) of data block 650 correspond to the 2 errors in overlap region of row codeword 4 (RCW4) and column codeword 2 (CCW2) of data block 450. The 3 errors in the overlap region of row codeword 2 (RCW2) and column codeword 4 (CCW4) of data block 650 correspond to the 2 errors in overlap region of row codeword 4 (RCW4) and column codeword 3 (CCW3) of data block 450. The 2 errors in the overlap region of row codeword 7 (RCW7) and column codeword 6 (CCW3) and the 3 errors in the overlap region of row codeword 0 (RCW0) and column codeword 7 (CCW7) of data block 650 correspond to the 5 errors in overlap region of row codeword 4 (RCW4) and column codeword 3 (CCW3) of data block 450. It may be noted that in some implementations, the logical associations may be predetermined, and the processing logic may cycle through the predetermined logical associations. For example, a controller may have 10 different logical associations stored in memory. If after a first remix operation (a first logical association to a second logical association), the first tier or error correcting code operations is not able to correct the error another remix operation may be performed (second logical association to a third logical association), until the error is corrected using the first tier of error correcting code operations.

With respect to data block logical representation 450 of FIG. 4B, the total number of errors (e.g., 5 bits) of the sixth column is greater than the correction capability of the column's error correcting code (e.g., t=4), which causes the first tier of error correcting code operations to perform an unsuccessful correction of an error. In data block logical representation 650 of FIG. 6B, the 5 errors are split between two overlap regions (i.e., 2 errors in the overlap region of row codeword 7 (RCW7) and column codeword 6 (CCW6) and the 3 errors in the overlap region of row codeword 0 (RCW0) and column codeword 7 (CCW7)). The total number of errors in each overlap region is less than the correction capability of the column's or row's error correcting code (e.g., t=4), which causes the first tier of error correcting code operations to perform a successful correction of the error.

Figure 7:
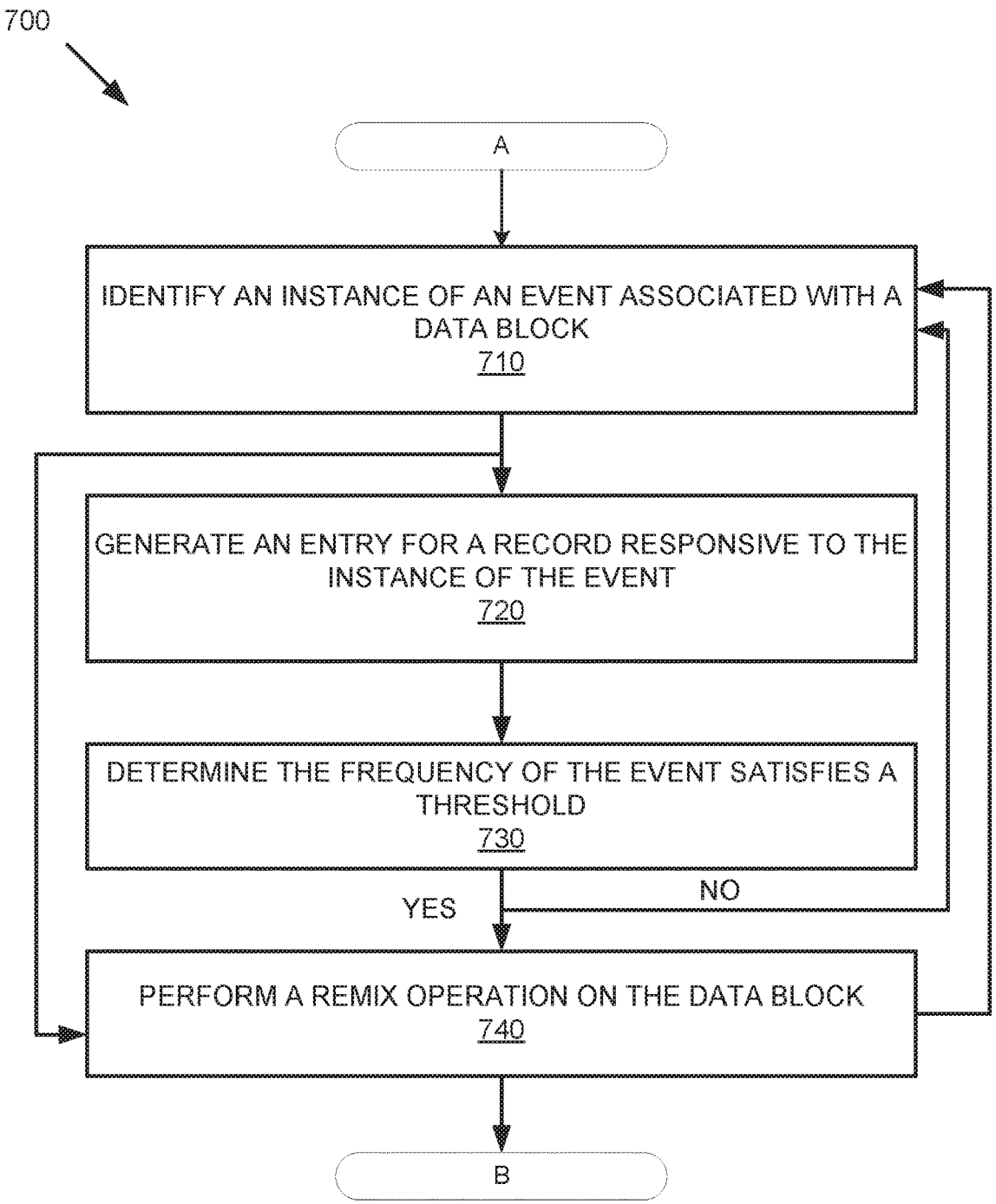
FIG. 7 is a flow diagram of an example method to perform a remix operation on a data block, in accordance with some embodiments.

FIG. 7 is a flow diagram of an example method 700 to perform a remix operation on a data block, in accordance with some embodiments. The method 700 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 may be performed by the remix component 113 of the controller 111 of FIG. 1. It may be noted that in other embodiments, method 700 may include the same, different, additional, or fewer operations performed in the same or different order.

Method 700 may begin at block 710 where processing device executing method 700 identifies an instance of an event association with error correcting code operations on a data block. For example, processing logic may perform a first tier of error correcting code operations on the data block and determine that the first tier of error correcting code operations are associated with an unsuccessful correction of the error of the data block. Processing logic may further perform a second tier of error correcting code operations on the data block and determine that the second tier of error correcting code operations are associated with a successful correction of the error of the data block. It may be noted that in one instance, the event can include the performance of a first tier of error correcting code operations on the data block where an unsuccessful correction of the error on the data block is determined and a performance of a second tier of error correcting code operations that successfully correct the error of the data block. Identifying an instance of an event may further be described with respect to FIG. 8. In some embodiments, responsive to identifying an instance of an event associated with a data block (block 710), processing logic may proceed to block 740 to perform a remix operation on the data block.

At block 720, subsequent to identifying an instance of an event associated with the data block, processing logic may generate an entry for a record responsive to identifying the instance of the event. The entry may indicate an occurrence of the event. In some embodiments, the record may be part of a table or other tool to keep track of the number of identified events. In other embodiments, the record may be a sketch or sketch-based record. A sketch may be a summary data structure that stores summarized information, which may reduce the amount of memory storage used to track or record information. In embodiments, a sketch may use hashing techniques to store the summarized information (e.g., hashes). In some embodiments, the sketch may include an estimation error where a sketch may correctly estimate or overestimate a stored value, but not underestimate the value.

At block 730, processing logic determines whether the frequency of the event satisfies a threshold. In some embodiments, the record may indicate the number of instances of the event identified in the record. The frequency of the event as indicated by the record may be compared to a threshold. For example, the frequency of the event may be 4 (f=4) and the threshold for the particular event may be 4. If the frequency of the event is greater than or equal to the threshold, the frequency of the event satisfies the threshold. If the frequency of the event is less than the threshold, the frequency of the event does not satisfy the threshold. If processing logic determines that the frequency of the event does not satisfy the threshold, processing logic may return to block 710. If processing logic determines that the frequency of the event satisfies the threshold, processing logic may proceed to block 740.

Figure 8:
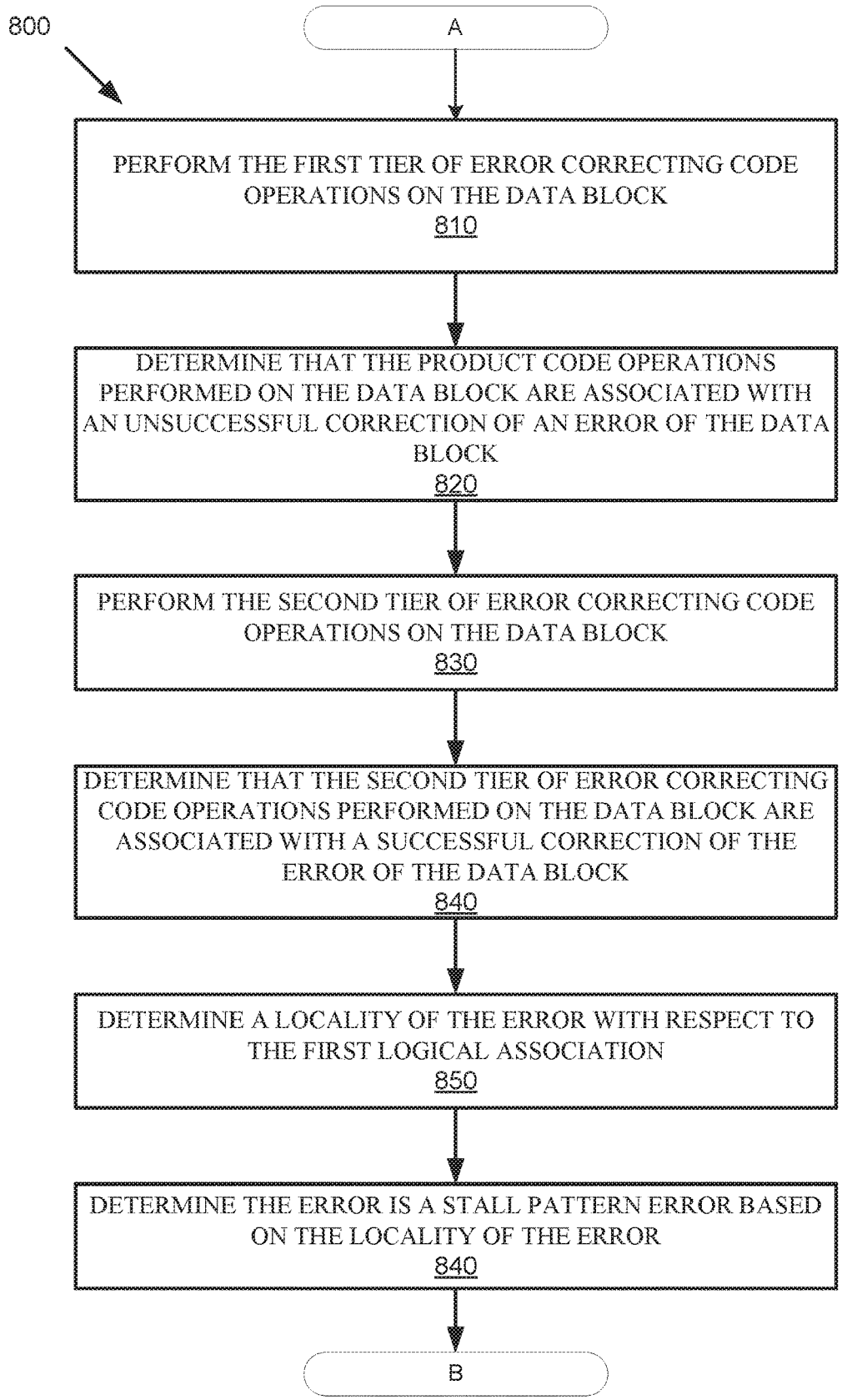
FIG. 8 is a flow diagram of an example method to identify an instance of an event associated with a data block, in accordance with some embodiments.

At block 740, processing logic performs a remix operation on the data block to change the logical to physical association of the data block from a first logical association to a second logical association. Subsequent to performing a remix operation, processing logic may return to block 710 and monitor for another instance of the event. Responsive to identifying another instance of an event associated with the data block (and in some embodiments, responsive to determining the frequency of the event satisfies a threshold), processing logic performs another remix operation on the data block to change the logical to physical association of the data block from a second logical association to a third logical association of a set of logical associations. In some embodiments, processing logic may iterate through the above described process until a logical association of a set of logical association prevents the triggering of an instance of an event association with the data block FIG. 8 is a flow diagram of an example method 800 to identify an instance of an event associated with a data block, in accordance with some embodiments. The method 800 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 may be performed by the remix component 113 of the controller 111 of FIG. 1. It may be noted that in other embodiments, method 800 may include the same, different, additional, or fewer operations performed in the same or different order. It may be noted that the instance of the event may include one or more of the below described operations (e.g., blocks) or other operations performed in any order.

Method 800 may begin at block 810 where processing logic may perform a first tier of error correcting code operations on the data block. In some embodiments, the first tier of error correcting code operations may include product code operations, such as product code decoding operations. At block 820, processing logic determines that the product code operations performed on the data block are associated with an unsuccessful correction of an error of the data block. At block 830, responsive to determining that the first tier of error correcting code operations is associated with an unsuccessful correction of the error of the data block, processing logic may perform a second tier of error correcting code operations on the data block. In some embodiments, the second tier of error correcting code operations may be BCH operations with additional correction capability. At block 840, processing logic may determine that the second tier of error correcting code operations performed on the data block are associated with a successful correction of the error of the data block.

At block 850, processing logic determines a locality of the error with respect to the first logical association. A locality of the error may refer to the location (e.g., the row and column of the error) of the error with respect to a logical representation of data block, such as data block 450 of FIG. 4B. At block 860, processing logic may determine that the error is a stall pattern error based on the locality of the error.

For example, to determine that the error is a stall pattern error based on the locality of errors, processing logic may determine a row of the two-dimensional array of rows and columns of the data block that is associated with the unsuccessful correction of the error. Processing logic may determine the column of the two-dimensional array or rows and columns of the data block that is associated with the unsuccessful correction of the error. Processing logic may identify the errors in an overlap region of the row and the column of the two-dimensional array. Processing logic may determine a first number of errors the first tier of error correcting code operations are to correct (e.g., correction capability). Processing logic may further determine that the error in the overlap region of the data block that caused the unsuccessful correction of the error includes a second number of errors that is greater than the correction capability of the first tier of error correcting code operations. If the errors are in the a particular overlap region and are a number greater than the correction capability of the first tier or error correcting code operations, processing logic may determine that the error is a stall pattern error.

In some embodiments, the stall pattern may be determined by performing an exclusive OR operation (XOR) using the incorrect data block (e.g., data block with the error) and the corrected data block. The XOR operation may produce a bitmap that shows the locality of errors with respect to the two-dimensional array. If the errors are in an overlap region and the number of errors exceed the correction capability of the first tier or error correcting code operations, processing logic may determine that the error is a stall pattern error.

In some embodiments, if processing logic determines that the error is a stall pattern error the error may be recorded as entry in the record. In other embodiments, if processing logic determines that the error is a stall pattern error processing logic may perform a remix operation. (See FIG. 7). In some embodiments, if the error is not determined to be a stall pattern error, processing logic may return to block 710 of FIG. 7 to identify an instance of the event associated with the data block.

In other embodiments, the instance of the event may include information indicative of whether the numbers of errors of a data block increases over time. For instance, a first tier of error correcting code operations may be performed and determine that the first tier of error correcting code operations on the data block is associated with an unsuccessful correction of the error, wherein the error includes 5 errors. At a subsequent time (a subsequent access of the data block), the first tier of error correcting code operations may again be performed, and determine that the error includes 7 errors. The instance of the event may be determined if the number of errors increases over time for the data block in view of the performance of multiple first tier of error correcting code operations.

Figure 9:
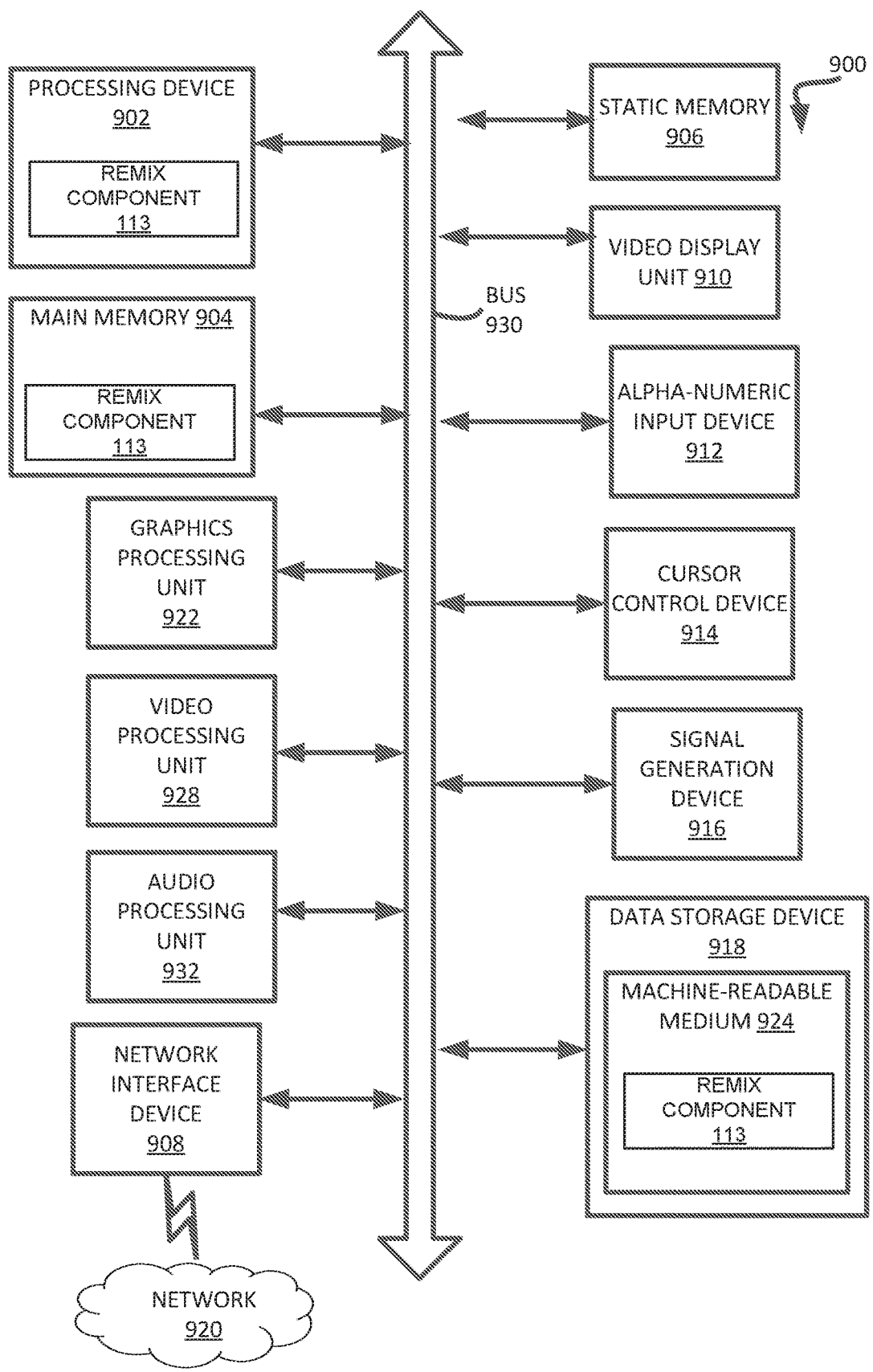
FIG. 9 is a block diagram of an example computer system in which embodiments of the disclosure may operate.

FIG. 9 illustrates an example machine of a computer system 900 within which a set of instructions, for causing the machine to perform any one or more of the methodologies discussed herein, may be executed. For example, the computer system 900 may include or utilize a storage device (e.g., the storage device 110 of FIG. 1) or may be used to perform the operations of a controller (e.g., to execute an operating system to perform operations corresponding to the remix component 113 of FIG. 1). In alternative embodiments, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage device 918, which communicate with each other via a bus 930.

Processing device 902 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 is configured to execute instructions for performing the operations discussed herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a computer-readable medium) on which is stored one or more sets of instructions or software embodying any one or more of the methodologies or functions described herein. The instructions may also reside, completely or at least partially, within the main memory 904 and/or within the processing device 902 during execution thereof by the computer system 900, the main memory 904 and the processing device 902 also constituting machine-readable storage media. The machine-readable storage medium 924, data storage device 918, and/or main memory 904 may correspond to the storage device 110 of FIG. 1.

In one embodiment, the instructions include instructions to implement functionality corresponding to a remix component 113 of FIG. 1. While the machine-readable storage medium 924 is shown in an example embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "remapping" or "performing" or "generating" or "comparing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the disclosure is not described with reference to any particular programming language. It will be appreciated that a variety of programming languages may be used to implement the teachings of the disclosure as described herein.

The disclosure may be provided as a computer program product, or software, that may include a machine-readable medium having stored thereon instructions, which may be used to program a computer system (or other electronic devices) to perform a process according to the disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications may be made thereto without departing from the broader spirit and scope of embodiments of the disclosure as set forth in the following claims. The specification and drawings are, accordingly, to be regarded in an illustrative sense rather than a restrictive sense.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

It is to be understood that the above description is intended to be illustrative, and not restrictive. Other embodiments will be apparent to those of skill in the art upon reading and understanding the above description. The scope of the disclosure may, therefore, be determined with reference to the appended claims, along with the full scope of equivalents to which such claims are entitled.

What is claimed is:

1. A system comprising:
   a non-volatile memory; and
   a processing device, coupled to the non-volatile memory, the processing device to perform operations comprising:
   identifying an instance of an event associated with error correcting code operations performed on a data block of the non-volatile memory;
   subsequent to identifying the instance of the event, generating an entry for a record, wherein the entry is indicative of the instance of the event;
   determining whether a frequency of the event satisfies a threshold condition based on the record; and
   responsive to determining that the frequency of the event satisfies the threshold condition, performing a remix operation on the data block to change a logical to physical association of the data block from a first logical association to a second logical association, wherein the change of the logical to physical association from the first logical association to the second logical association logically redistributes one or more errors in the data block.

2. The system of claim 1, wherein the non-volatile memory comprises a cross-point array of non-volatile memory cells.

3. The system of claim 1, wherein identifying the instance of the event associated with the error correcting code operations performed on the data block of the non-volatile memory, comprises:
    performing a first tier of the error correcting code operations on the data block; and
    determining that the first tier of the error correcting code operations on the data block is associated with an unsuccessful correction of an error of the data block.

4. The system of claim 3, wherein identifying the instance of the event associated with the error correcting code operations performed on the data block of the non-volatile memory, further comprises:
    performing a second tier of the error correcting code operations on the data block; and
    determining that the second tier of the error correcting code operations on the data block is associated with a successful correction of the error of the data block.

5. The system of claim 3, wherein the first tier of the error correcting code operations comprises product code operations.

6. The system of claim 3, wherein identifying the instance of the event associated with the error correcting code operations performed on the data block of the non-volatile memory, further comprises:
    determining a locality of the error with respect to the first logical association; and
    determining the error is a stall pattern error based on the locality of the error.

7. The system of claim 1, wherein the record is a summary data structure using hashes to store summarized information.

8. A method comprising:
    identifying an instance of an event associated with error correcting code operations performed on a data block of non-volatile memory;
    subsequent to identifying the instance of the event, generating an entry for a record, wherein the entry is indicative of the instance of the event;
    determining whether a frequency of the event satisfies a threshold condition based on the record; and
    responsive to determining that the frequency of the event satisfies the threshold condition, performing, by a processing device, a remix operation on the data block to change a logical to physical association of the data block from a first logical association to a second logical association, wherein the change of the logical to physical association from the first logical association to the second logical association logically redistributes one or more errors in the data block.

9. The method of claim 8, wherein the non-volatile memory comprises a cross-point array of non-volatile memory cells.

10. The method of claim 8, wherein identifying the instance of the event associated with the error correcting code operations performed on the data block of the non-volatile memory, comprises:
    performing a first tier of the error correcting code operations on the data block; and
    determining that the first tier of the error correcting code operations on the data block is associated with an unsuccessful correction of an error of the data block.

11. The method of claim 8, wherein identifying the instance of the event associated with the error correcting code operations performed on the data block of the non-volatile memory, comprises:
    performing a second tier of the error correcting code operations on the data block; and
    determining that the second tier of the error correcting code operations on the data block is associated with a successful correction of the error of the data block.

12. The method of claim 10, wherein the first tier of the error correcting code operations comprises product code operations.

13. The method of claim 8, wherein identifying the instance of the event associated with the error correcting code operations performed on the data block of the non-volatile memory, comprises:
    determining a locality of the error with respect to the first logical association; and
    determining the error is a stall pattern error based on the locality of the error.

14. The method of claim 8, wherein the record is a summary data structure using hashes to store summarized information.

15. A non-transitory computer-readable storage medium comprising instructions that, when executed by a processing device, cause the processing device to perform operations comprising:
    identifying an instance of an event associated with error correcting code operations performed on a data block of non-volatile memory;
    subsequent to identifying the instance of the event, generating an entry for a record, wherein the entry is indicative of the instance of the event;
    determining whether a frequency of the event satisfies a threshold condition based on the record; and
    responsive to determining that the frequency of the event satisfies the threshold condition, performing, by a processing device, a remix operation on the data block to change a logical to physical association of the data block from a first logical association to a second logical association, wherein the change of the logical to physical association from the first logical association to the second logical association logically redistributes one or more errors in the data block.

16. The non-transitory computer-readable storage medium of claim 15, wherein the non-volatile memory comprises a cross-point array of non-volatile memory cells, and wherein a first tier of the error correcting code operations comprises product code operations.

17. The non-transitory computer-readable storage medium of claim 15, wherein identifying the instance of the event associated with the error correcting code operations performed on the data block of the non-volatile memory, comprises:
    performing a first tier of the error correcting code operations on the data block; and
    determining that the first tier of the error correcting code operations on the data block is associated with an unsuccessful correction of an error of the data block.

18. The non-transitory computer-readable storage medium of claim 15, wherein the record is a summary data structure using hashes to store summarized information.

19. The non-transitory computer-readable storage medium of claim 15, wherein identifying the instance of the event associated with the error correcting code operations performed on the data block of the non-volatile memory, comprises:
   performing a second tier of the error correcting code operations on the data block; and
   determining that the second tier of the error correcting code operations on the data block is associated with a successful correction of the error of the data block.

20. The non-transitory computer-readable storage medium of claim 15, wherein identifying the instance of the event associated with the error correcting code operations performed on the data block of the non-volatile memory, comprises:
   determining a locality of the error with respect to the first logical association; and
   determining the error is a stall pattern error based on the locality of the error.

\* \* \* \* \*